(12) United States Patent
Lee et al.

(10) Patent No.: US 8,187,967 B2
(45) Date of Patent: May 29, 2012

(54) METHOD OF MANUFACTURING A NON-VOLATILE MEMORY DEVICE

(75) Inventors: Seung-jun Lee, Suwon-si (KR); Woon-kyung Lee, Seongnam-si (KR); Seung-wan Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 514 days.

(21) Appl. No.: 12/458,675

(22) Filed: Jul. 20, 2009

(65) Prior Publication Data
US 2010/0173485 A1 Jul. 8, 2010

(30) Foreign Application Priority Data
Jan. 7, 2009 (KR) .................. 10-2009-0001246

(51) Int. Cl.
*H01L 21/4763* (2006.01)
(52) U.S. Cl. .................................................... 438/618
(58) Field of Classification Search .................. 438/618, 438/583, 630, 649, 586
See application file for complete search history.

(56) References Cited

U.S. PATENT DOCUMENTS

| | | | |
|---|---|---|---|
| 5,879,986 A * | 3/1999 | Sung ............................. 438/253 |
| 7,279,419 B2 * | 10/2007 | Kim et al. ..................... 438/668 |
| 7,348,236 B2 | 3/2008 | Abbott et al. | |
| 7,553,729 B2 * | 6/2009 | Choi ............................. 438/266 |
| 7,883,952 B2 * | 2/2011 | Lim ............................. 438/199 |
| 8,089,137 B2 * | 1/2012 | Lung et al. ..................... 257/601 |
| 2002/0102790 A1 * | 8/2002 | Kim ............................. 438/239 |
| 2007/0275519 A1 * | 11/2007 | Choi ............................. 438/197 |

FOREIGN PATENT DOCUMENTS

KR 10-2002-0065113 A 8/2002
KR 10-2007-0039730 A 4/2007

* cited by examiner

*Primary Examiner* — Thao P. Le
(74) *Attorney, Agent, or Firm* — Lee & Morse, P.C.

(57) ABSTRACT

A method of manufacturing a non-volatile memory device providing a semiconductor layer in which a cell region and a peripheral region are defined, sequentially forming a first insulating layer, a first conductive layer, a second insulating layer, and a second conductive layer on the cell region and the peripheral region, forming a trench for exposing a portion of the first conductive layer of the peripheral region, wherein the trench is formed by removing portions of the second conductive layer and the second insulating layer in the peripheral region, performing a trimming operation for removing portions of the second conductive layer and the second insulating layer of the cell region, forming a spacer on a side surface of the trench, and forming a silicide layer that is electrically connected to the first conductive layer, wherein the silicide layer is formed by performing a silicidation process on the spacer.

16 Claims, 11 Drawing Sheets

METHOD OF MANUFACTURING A NON-VOLATILE MEMORY DEVICE

BACKGROUND

1. Field

The inventive concept relates to a method of manufacturing a non-volatile memory device, and more particularly, to a method of manufacturing a non-volatile memory device having a butting contact structure.

2. Description of the Related Art

A non-volatile memory semiconductor apparatus may be required to process a large amount of data and to have a small size. Hence, it may be required to increase the integration density of non-volatile memory devices for forming such a non-volatile memory semiconductor apparatus. In order to simplify a manufacturing procedure, cell transistors of a cell region and selection transistors of a peripheral region in the non-volatile memory device may be formed simultaneously. Since each of the selection transistors may not necessarily need to have a charge storage layer, each of the selection transistors may have a butting contact structure for directly and electrically connecting a control gate to a conductive layer.

SUMMARY

Embodiments are therefore directed to a method of manufacturing a non-volatile memory device with a butting contact structure, which substantially overcomes one or more of the problems due to the limitations and disadvantages of the related art.

According to one aspect of the inventive concept, there is provided a method of manufacturing a non-volatile memory device, including providing a semiconductor layer in which a cell region and a peripheral region are defined, sequentially forming a first insulating layer, a first conductive layer, a second insulating layer, and a second conductive layer in the cell region and the peripheral region, forming a trench exposing a portion of the first conductive layer in the peripheral region, wherein the trench is formed by removing portions of the second conductive layer and the second insulating layer in the peripheral region, performing a trimming operation for removing portions of the second conductive layer and the second insulating layer in the cell region, forming a spacer on a side surface of the trench, and forming a silicide layer by performing a silicidation process on the spacer by using a metal, wherein the silicide layer is electrically connected to the first conductive layer.

The operation of forming the trench and the operation of performing the trimming operation may be performed simultaneously.

After the operation of forming the silicide layer is performed, the method may further include the operation of forming an electrode layer by filling the trench, wherein the electrode layer is electrically connected to the silicide layer. The electrode layer may be formed to directly contact the second insulating layer.

The silicide layer may further include at least a portion of the second conductive layer in the peripheral region. Forming the silicide layer may further include performing the silicidation process on the entire second conductive layer in the peripheral region, such that the silicide layer is directly on at least two perpendicular surfaces of the second insulating layer.

The spacer may further include polysilicon. Also, the metal may include cobalt (Co), nickel (Ni), titanium (Ti) and tungsten (W) and a composition thereof.

The cell region may include a plurality of cell transistors. The peripheral region may include at least one of a string selection transistor, a ground selection transistor, a low voltage transistor and a high voltage transistor.

The cell region may be patterned using a self-aligned double patterning (SADP) method.

The first and second conductive layers may be formed of polysilicon. Forming the silicide layer may include further performing the silicidation process on the first and second conductive layers, the silicide layer being formed on the exposed portion of the first conductive layer in the trench and on exposed surfaces of the second conductive layer in the peripheral region. Forming the silicide layer on the second conductive layer may include forming the silicide layer to overlap at least two surfaces of the second conductive layer, the two surfaces of the second conductive layer being perpendicular to each other. Forming the silicide layer on the second conductive layer may include forming the silicide layer to overlap an entire top surface of the second conductive layer in the peripheral region, the top surface of the conductive layer facing away from the semiconductor layer.

According to another aspect of the inventive concept, there is provided a method of manufacturing a non-volatile memory device, including providing a semiconductor layer which comprises an active region defined by a device isolation region and in which a cell region and a peripheral region are defined, sequentially forming a first insulating layer, a first conductive layer, a second insulating layer, and a second conductive layer in the cell region and the peripheral region, forming a trench in the active region exposing a portion of the first conductive layer in the peripheral region, wherein the trench is formed by removing portions of the second conductive layer and the second insulating layer in the peripheral region disposed in the active region, performing a trimming operation for removing portions of the second conductive layer and the second insulating layer in the cell region, forming a spacer on a side surface of the trench, and forming a silicide layer by performing a silicidation process on the spacer by using a metal, wherein the silicide layer is electrically connected to the first conductive layer.

According to another aspect of the inventive concept, there is provided a method of manufacturing a non-volatile memory device, including providing a semiconductor layer in which a cell region and a peripheral region are defined, sequentially and respectively forming a first insulating layer, a first conductive layer, a second insulating layer, and a second conductive layer in the cell region and the peripheral region, forming a trench exposing a portion of the first conductive layer in the peripheral region, wherein the trench is formed by removing portions of the second conductive layer and the second insulating layer in the peripheral region, performing a trimming operation for removing portions of the second conductive layer and the second insulating layer in the cell region, forming a silicide layer by performing a silicidation process on an exposed top surface of the first conductive layer and a side surface of the second conductive layer, wherein the silicidation process is performed by using a metal, and forming an electrode layer that is electrically connected to the silicide layer and the first conductive layer.

According to another aspect of the inventive concept, there is provided a memory card including a non-volatile memory device with a butting contact structure manufactured according to the method, and a controller for controlling the memory and exchanging data with the memory.

According to another aspect of the inventive concept, there is provided a system including a non-volatile memory device with a butting contact structure manufactured according to the method, a processor for communicating with the memory via a bus, and an input/output device for communicating with the bus.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
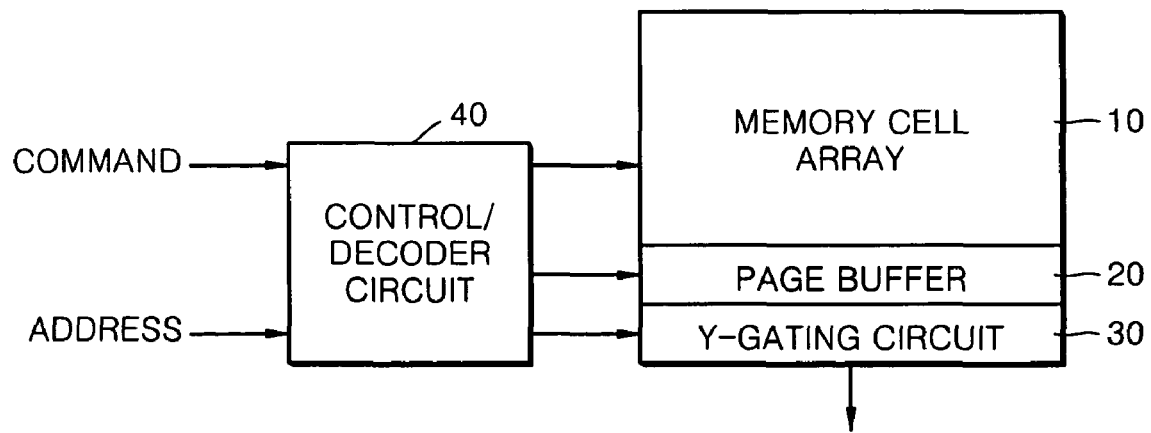
FIG. 1 illustrates a block diagram of a non-volatile memory device according to an embodiment.

Korean Patent Application No. 10-2009-0001246, filed on Jan. 7, 2009, in the Korean Intellectual Property Office, and entitled: "Method of Manufacturing Non-Volatile Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a non-volatile memory device according to an embodiment.

Referring to FIG. 1, the non-volatile memory device may include a memory cell array 10, a page buffer 20, a Y-gating circuit 30, and a control/decoder circuit 40.

The memory cell array 10 may include a plurality of memory blocks, and each of the plurality of memory blocks may include a plurality of non-volatile memory cells. The non-volatile memory cells may be flash memory cells, e.g., NAND flash memory cells. The page buffer 20 may temporarily store data to be written in the memory cell array 10, or data to be read from the memory cell array 10. The Y-gating circuit 30 may transmit data stored in the page buffer 20. The control/decoder circuit 40 may receive a command and an address from the outside, may output a control signal to write data in the memory cell array 10 and/or to read data from the memory cell array 10, and decode the address. The control/decoder circuit 40 may output a control signal for input and output of data to the page buffer 20 and may provide address information to the Y-gating circuit 30.

Figure 2:
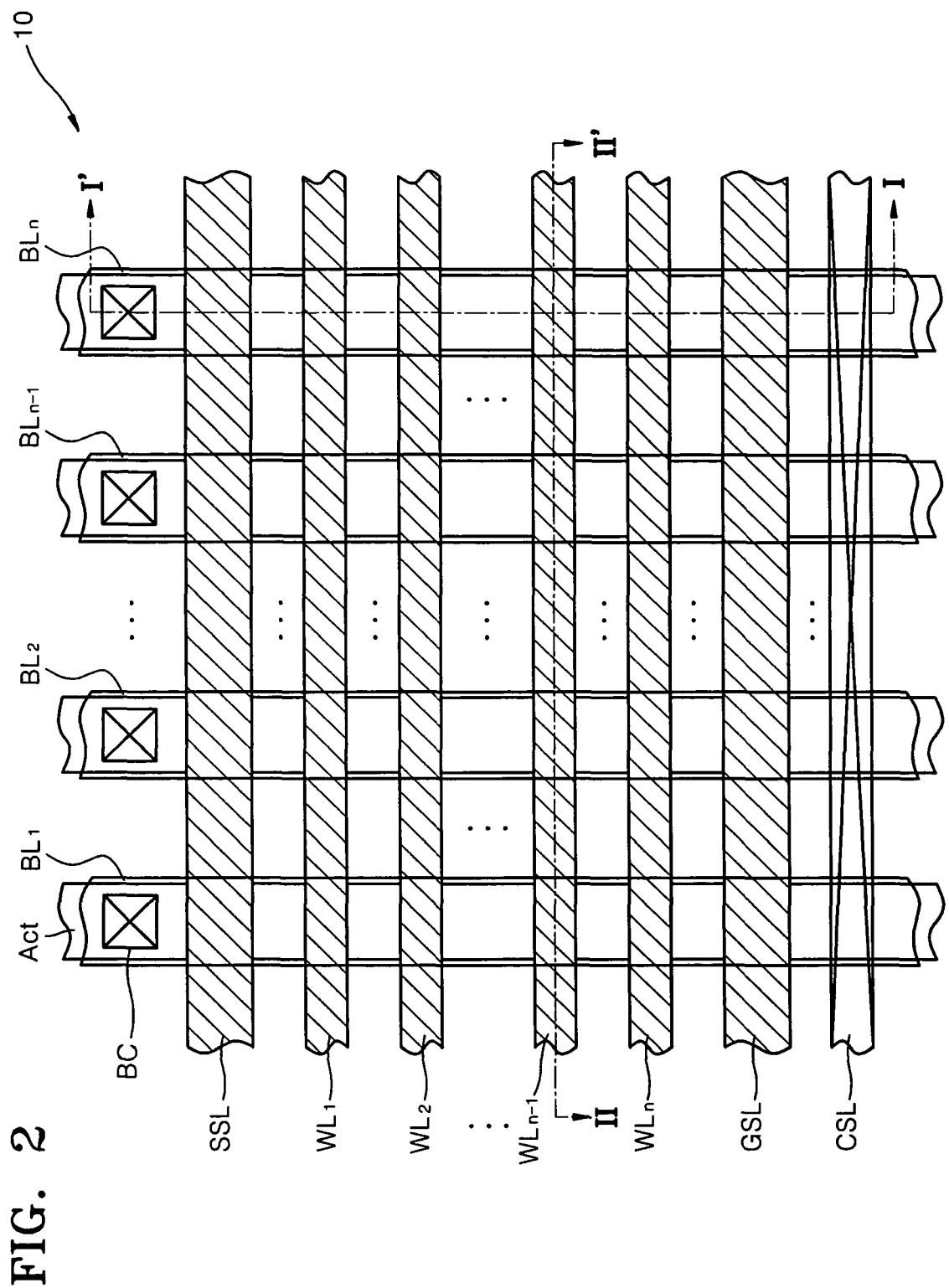
FIG. 2 illustrates a layout (a plan view) of a portion of a memory cell array according to an embodiment.
Figure 3A:
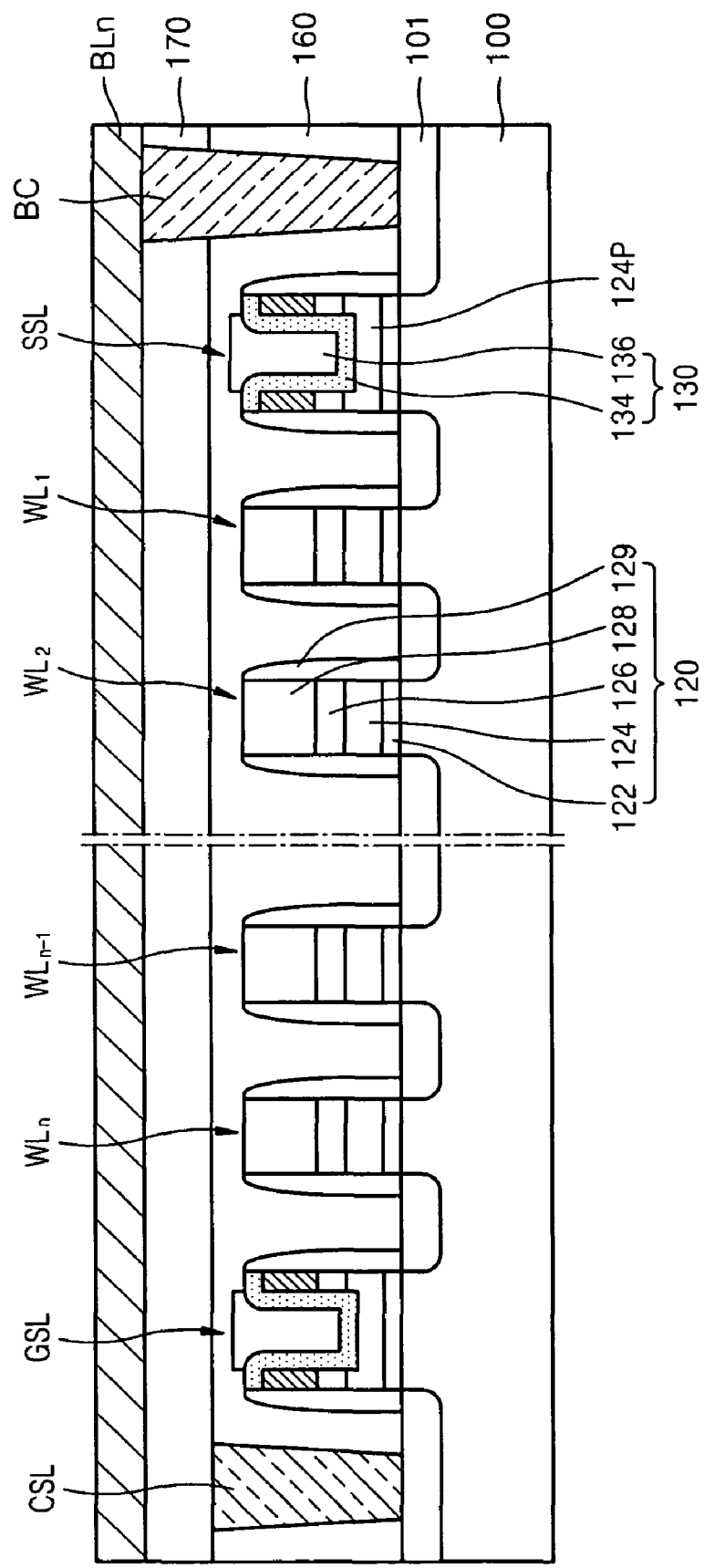
FIGS. 3A and 3B illustrate cross-sectional views taken along lines I-I' and II-II' of FIG. 2, respectively.
Figure 3B:
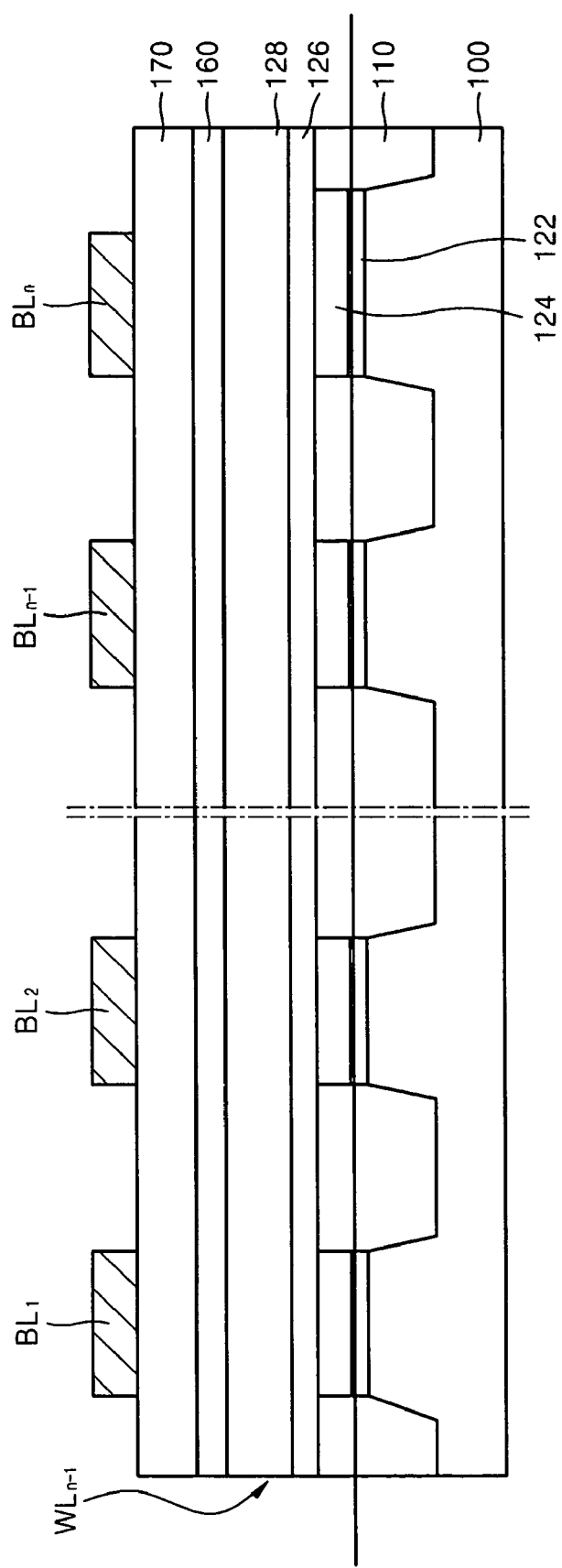

FIG. 2 illustrates a layout of a portion of a memory cell array according to an embodiment. The portion of the memory cell array shown in FIG. 2 may be a portion of the memory cell array 10. FIGS. 3A and 3B illustrate cross-sectional views taken along lines I-I' and II-II' of FIG. 2, respectively.

Referring to FIGS. 2 and 3A-3B, the memory cell array 10 may include a plurality of active regions Act that may be defined by device isolation regions 110 formed in a semiconductor layer 100. The semiconductor layer 100 may include a substrate having semiconductor materials, e.g., silicon, silicon-germanium, an epitaxial layer, a silicon-on-insulator layer, a semiconductor-on-insulator, or the like. The active regions Act may have the form of parallel lines.

A string selection line SSL and a ground selection line GSL may be positioned over the active regions Act along a direction crossing a direction of the active regions Act. A plurality of word lines WL1, WL2, . . . , WLn−1, and WLn may be positioned over the active regions Act between the string selection line SSL and the ground selection line GSL. The string selection line SSL, the ground selection line GSL, and the word lines WL1, WL2, . . . , WLn−1, and WLn may be parallel to one another. Impurity regions 101 may be formed in the active regions Act adjacent to both sides of each of the word lines WL1, WL2, . . . , WLn−1, and WLn, the string selection line SSL, and the ground selection line GSL. As a result, a string selection transistor, cell transistors, and a ground selection transistor connected in series may be formed. The string selection transistor, the ground selection transistor, and the cell transistors interposed between the string and ground selection transistors may constitute a unit memory block. The impurity region 101 disposed adjacent to the string selection line SSL and opposite to the ground selection line GSL may be defined as a drain region of the string selection transistor. Also, the impurity region 101 disposed adjacent to the ground selection line GSL and opposite to the string selection line SSL may be defined as a source region of the ground selection transistor.

Each of the word lines WL1, WL2, . . . , WLn−1, and WLn may include a gate stack 120. The gate stack 120 may include a tunneling insulating layer 122, a charge storage layer 124, a blocking insulating layer 126, and a gate conductive layer 128 that may be stacked sequentially on the semiconductor layer 100. Although not illustrated, each of the word lines WL1, WL2, . . . , WLn−1, and WLn may further include a cell barrier conductive layer and a word line conductive layer that may be stacked sequentially on the gate conductive layer 128.

Each of the tunneling insulating layer 122 and the charge storage layer 124 may be separated into portions with respect to the cell transistors disposed adjacently in the direction of the word lines WL1, WL2, . . . , WLn−1, and WLn. For example, as illustrated in FIG. 3B, each portion of the tunneling insulating layer 122 and a corresponding portion of the charge storage layer 124 thereon may be under a different bit line and may be separated, e.g., completely separated, from an adjacent portion of the tunneling insulating layer 122 and a corresponding portion of the charge storage layer 124 thereon by a device isolation region 110. Top surfaces of the device isolation regions 110 may be at a substantially same level as a top surface of the charge storage layer 124. The tunneling insulating layer 122 may be, e.g., a silicon oxide layer. The charge storage layer 124 may be a charge trapping layer or a floating gate conductive layer. The blocking insulating layer 126 may be shared among the cell transistors disposed adjacently in the direction of the word lines WL1, WL2, . . . , WLn−1, and WLn, e.g., the blocking insulating layer 126 may overlap the device isolation region 110 and the charge storage layer 124. In addition, the blocking insulating layer 126 may have a multi-layer structure, e.g., the blocking insulating layer 126 may include a silicon oxide layer and a high-k dielectric layer. A spacer 129 may be disposed on side surfaces of the tunneling insulating layer 122, the charge storage layer 124, the blocking insulating layer 126, and the gate conductive layer 128. The spacer 129 may be formed as a multi layer.

In general, widths of the string selection line SSL and the ground selection line GSL may be greater than those of the word lines WL1, WL2, . . . , WLn−1, and WLn. However, this is an exemplary embodiment, and the inventive concept is not limited thereto. The string selection line SSL and ground selection line GSL may have the same stacked structures as the word lines WL1, WL2, . . . , WLn−1, and WLn described above.

Each of the selection transistors included in the string selection line SSL and the ground selection line GSL may individually have a butting contact structure 130. The butting contact structure 130 may be electrically and directly connected to a peripheral region charge storage layer 124p, i.e., a portion of the charge storage layer 124 in the peripheral region. The butting contact structure 130 may be formed of a conductive material, e.g., metal or metal silicide, and may be formed of a single material or may have a multi-layer structure formed by stacking a plurality of layers. A structure of the butting contact structure 130 and a method of forming the butting contact structure 130 will be described later.

A first interlayer insulating layer 160 may be provided on the word lines WL1, WL2, . . . , WLn−1, and WLn, the string selection line SSL, and the ground selection line GSL. A common source line CSL may be disposed through the first interlayer insulating layer 160, and may be connected to the source region of the ground selection line GSL. The common source line CSL may be disposed parallel to the ground selection line GSL. A second interlayer insulating layer 170 may be provided on the first interlayer insulating layer 160. A bit line plug BC may be disposed through the second interlayer insulating layer 170 and the first interlayer insulating layer 160, and may be connected to the drain region of the string selection line SSL. Bit lines BL1, BL2, . . . , BLn−1, and BLn may be disposed on the second interlayer insulating layer 170 and connected to the bit line plug BC. Also, the bit lines BL1, BL2, . . . , BLn−1, and BLn may be over the word lines WL1, WL2, . . . , WLn−1, and WLn, and may be positioned to cross the word lines WL1, WL2, . . . , WLn−1, and WLn. The bit lines BL1, BL2, . . . , BLn−1, and BLn may be disposed parallel to the active regions Act.

Referring back to FIG. 3B, the tunneling insulating layer 122, the charge storage layer 124, the blocking insulating layer 126, and the gate conductive layer 128 may be sequentially stacked on the semiconductor layer 100.

The tunneling insulating layer 122 may be formed using a dry oxidation method or a wet oxidation method. For example, when the tunneling insulating layer 122 is formed using a wet oxidation method, a wet oxidation process may be performed at a temperature of about 700° C. to about 800° C., and then an annealing process may be performed at about 900° C. in a nitrogen atmosphere for about 20 minutes to about 30 minutes to form the tunneling insulating layer 122. Also, the tunneling insulating layer 122 may be a single layer or a multi-layer including at least one material of, e.g., silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 124 may be formed to be a floating gate or a charge trap layer. When the charge storage layer 124 is formed to be a floating gate layer, the charge storage layer 124 may be formed, e.g., by depositing polysilicon. For example, the polysilicon may be deposited by performing chemical vapor deposition (CVD) or a low pressure chemical vapor deposition (LPCVD) using, e.g., $SiH_4$ gas or a gaseous mixture of $Si_2H_6$ and $PH_3$. When the charge storage layer 124 is formed to be a charge trap layer, the charge storage layer 124 may be a single layer or a multi-layer including at least one of, e.g., silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride (AlGaN).

The blocking insulating layer 126 may be a single layer or a multi-layer formed by stacking a plurality of layers individually including at least one of silicon oxide ($SiO_2$), silicon nitride ($Si_3N_4$), silicon oxynitride (SiON), and a high-k dielectric layer. The high-k dielectric layer may include at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), and praseodymium oxide ($Pr_2O_3$).

The gate conductive layer 128 may be a single layer or a multi-layer including at least one of, e.g., polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and nitrides or silicides thereof.

However, the tunneling insulating layer 122, the charge storage layer 124, the blocking insulating layer 126, and the gate conductive layer 128 described above are merely examples, and thus, the inventive concept is not limited thereto.

FIGS. 4A, 5A, 6A, 7A, and 8A illustrate top views, and FIGS. 4B, 5B, 6B, 7B, and 8B illustrate cross-sectional views, respectively, taken along lines A-A', B-B', and C-C' of FIGS. 4A, 5A, 6A, 7A, and 8A for describing a method of manufacturing a non-volatile memory device, according to an embodiment of the inventive concept. Here, line A-A' illustrates a cross-section of a string selection line SSL (see FIG. 2) or ground selection line GSL (see FIG. 2) above an active region Act. Line B-B' illustrates a cross-section of the string selection line SSL or the ground selection line GSL outside the active region Act. Line C-C' illustrates a cross-section of a wordline WL1 (see FIG. 2).

Figure 4A:
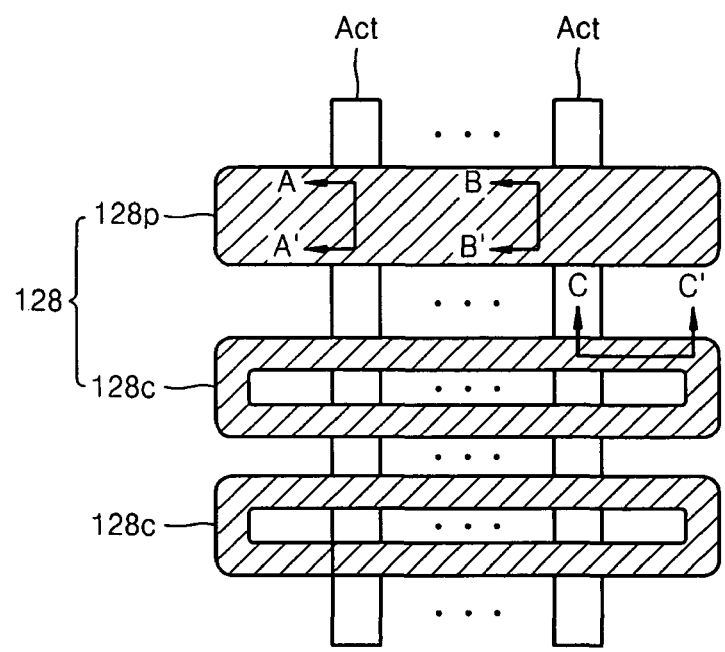
FIGS. 4A, 5A, 6A, 7A, and 8A illustrate top views
Figure 4B:
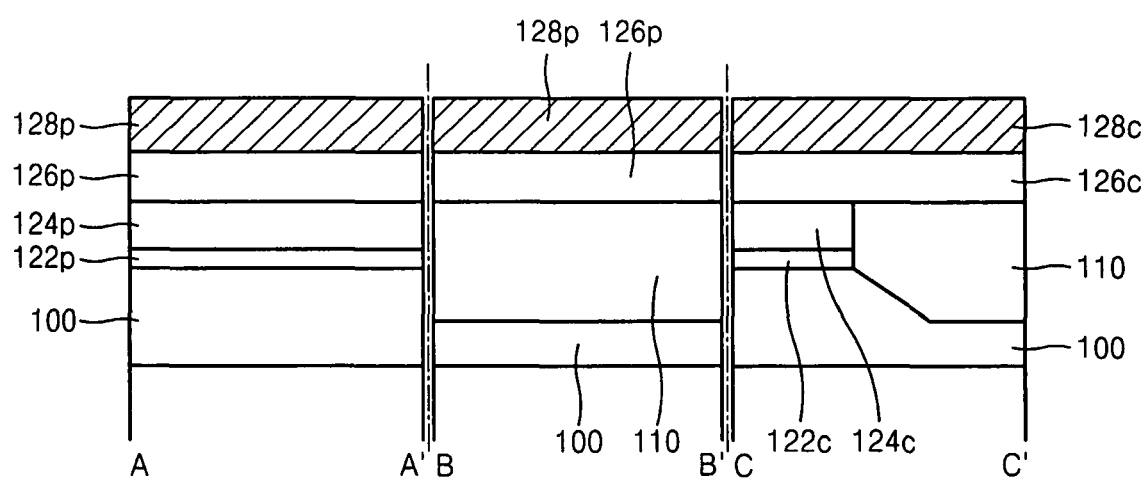
FIGS. 4B, 5B, 6B, 7B, and 8B illustrate cross-sectional views taken along lines A-A', B-B', and C-C' in FIGS. 4A, 5A, 6A, 7A, and 8A, respectively, for describing a method of manufacturing a non-volatile memory device according to an embodiment.

Referring to FIGS. 4A and 4B, a plurality of layers may be formed and patterned on the semiconductor layer 100. The active region Act may be defined to be on the semiconductor layer 100 by the device isolation region 110. Source/drain regions and a channel region between the source/drain regions may be formed in the active region Act. Also, a well region formed using an ion implantation process may be formed in the semiconductor layer 100. For convenience of description, two active regions Act are illustrated in FIG. 4A but the inventive concept is not limited thereto. For example, as illustrated in FIG. 2, n active regions Act may be disposed. A cell region and a peripheral region may be defined in the semiconductor layer 100. The cell region corresponds to a region in which a plurality of cell transistors may be formed. The peripheral region corresponds to a region in which at least one of a string selection transistor, a ground selection transistor, a low voltage transistor, or a high voltage transistor may be formed. Hereinafter, the string selection line SSL, as the peripheral region, is described, where the string selection transistor is formed. Also, hereinafter, in order to distinguish the tunneling insulating layer 122, the charge storage layer 124, the blocking insulating layer 126, and the gate conductive layer 128 (refer to FIGS. 3A and 3B) with respect to the peripheral region and the cell region, "p" and "c" are respectively added to reference numerals thereof. For example, a portion of the gate conductive layer 128 in the peripheral region will be referred to as a peripheral gate conductive layer 128p and a portion of the gate conductive layer 128 in the cell region will be referred to as a cell gate conductive layer 128c.

The semiconductor layer 100 may have a plurality of layers stacked thereon as follows. First, cell and peripheral tunneling insulating layers 122c and 122p, cell and peripheral charge storage layers 124c and 124p, and cell and peripheral blocking insulating layers 126c and 126p may be sequentially disposed on the active regions Act. As illustrated in FIG. 4B, portions of the cell and peripheral blocking insulating layers 126c and 126p may be directly disposed on the device isolation region 110 outside the active regions Act. The cell and peripheral gate conductive layers 128c and 128p may be disposed on the cell and peripheral blocking insulating layers 126c and 126p, respectively. The cell and peripheral tunneling insulating layers 122c and 122p, the cell and peripheral charge storage layers 124c and 124p, the cell and peripheral blocking insulating layers 126c and 126p, and the cell and peripheral gate conductive layers 128c and 128p may form a cell region transistor structure or a peripheral region transistor structure as will be explained with respect to a subsequent process.

Also, the cell tunneling insulating layer 122c, the cell charge storage layer 124c, the cell blocking insulating layer 126c, and the cell gate conductive layer 128c may be patterned using a self-aligned double patterning (SADP) method and thus may form the cell region transistor structure. Here, as illustrated in FIG. 4A, when the SADP method is used, a ring-type pattern may be generated to form the cell region transistor structure. More specifically, with reference to the SADP method, a sacrificial layer (not shown) may be formed on the semiconductor layer 100, and a spacer (not shown) may be formed around the sacrificial layer. Then, an etching process may be performed to remove the sacrificial layer, and thus the spacer may form the ring-type pattern. By doing so, the ring-type pattern may define a frame exposing a portion of the active region Act between opposite sides of the frame. As will be explained with reference to a subsequent process and FIGS. 5A-5B, the ring-type pattern may define two cell transistor strings (or two word lines), i.e., two opposite portions of one ring pattern extending along a direction of the word lines may define two separate word lines. Also, as illustrated in FIG. 4A, a width of the peripheral region gate conductive layer 128p may be greater than a width of the cell region gate conductive layer 128c. However, the inventive concept is not limited thereto.

Figure 5A:
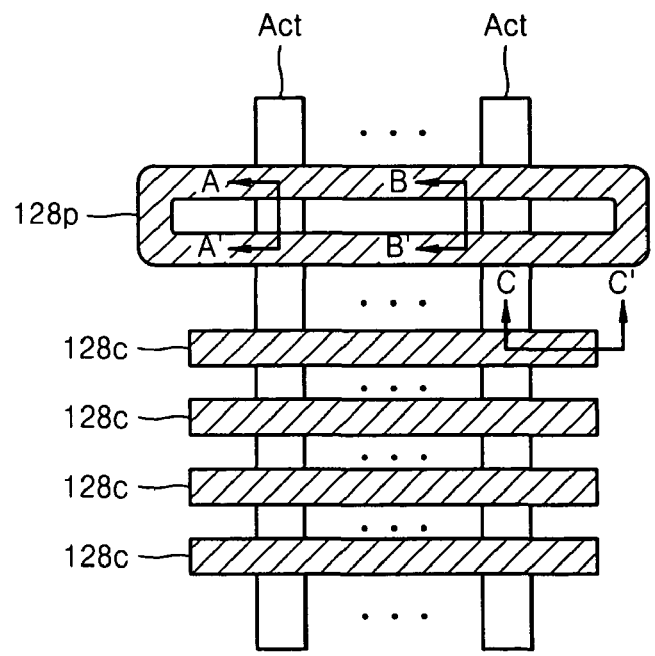
Figure 5B:
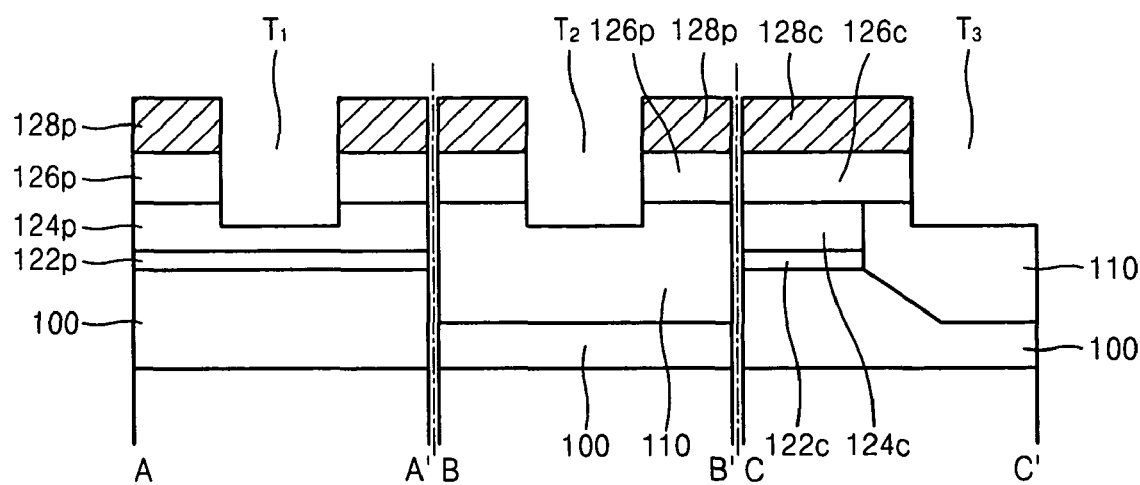

Referring to FIGS. 5A and 5B, first and second trenches T1 and T2 may be formed by removing a portion of the peripheral region gate conductive layer 128p. The first and second trenches T1 and T2 may be formed using, e.g., a general etching method. The first trench T1 may be disposed in the active region Act, and the second trench T2 may be disposed in the device isolation region 110. The first trench T1 may penetrate the peripheral blocking insulating layer 126p disposed under the peripheral gate conductive layer 128p and thus may expose the peripheral charge storage layer 124p. Also, the second trench T2 may penetrate the peripheral blocking insulating layer 126p disposed under the peripheral gate conductive layer 128p and thus may expose the device isolation region 110. However, the inventive concept is not limited thereto. For example, as illustrated in FIG. 5A, formation of the first and second trenches T1 and T2 may define the peripheral gate conductive layer 128p and the peripheral blocking insulating layer 126p in a ring-type pattern, i.e., in a plan view. In another example, only the first trench T1 may be disposed in the active region Act and the second trench T2 may not be formed in the device isolation region 110.

Also, a third trench T3 may be formed in the cell region. Due to the third trench T3, an end portion of the ring-type pattern of the cell gate conductive layer 128c may be trimmed to form the two cell transistor strings (or the two word lines) from a single ring of the ring-type pattern. In other words, end portions of the ring-type pattern may be removed during the trimming process, so the cell gate conductive layers 128c may have parallel line shapes separate, e.g., completely separate, from each other, as illustrated in FIG. 5A. As illustrated in FIG. 5B, the third trench T3 may expose the device isolation region 110 but may not expose the cell tunneling insulating layer 122c and the cell charge storage layer 124c, i.e., a portion of the device isolation layer 110 may remain between the third trench T3 and the cell tunneling insulating layer 122c and the cell charge storage layer 124c. Formation of the third trench T3, i.e., the trimming process, may be performed at the same time or a different time as formation of the first and second trenches T1 and T2.

Figure 6A:
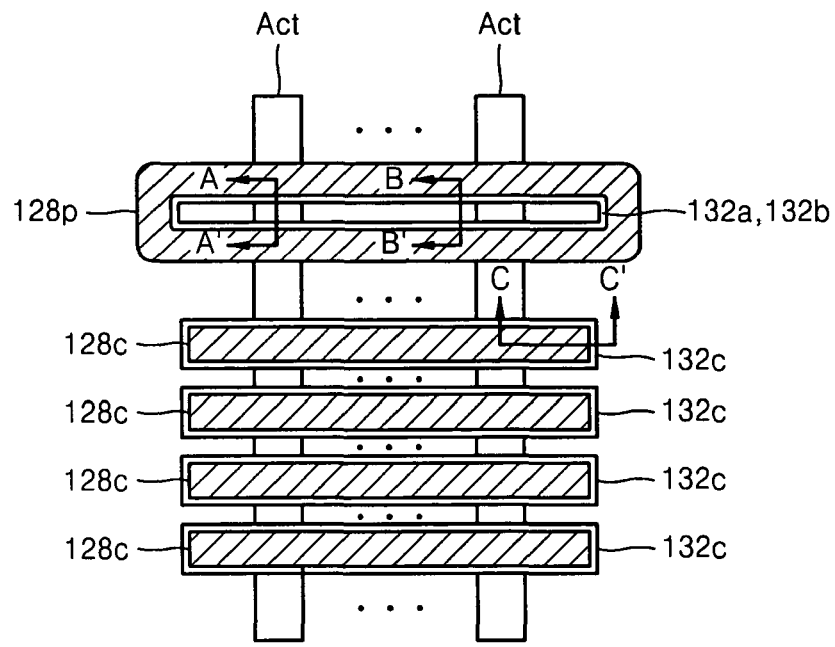
Figure 6B:
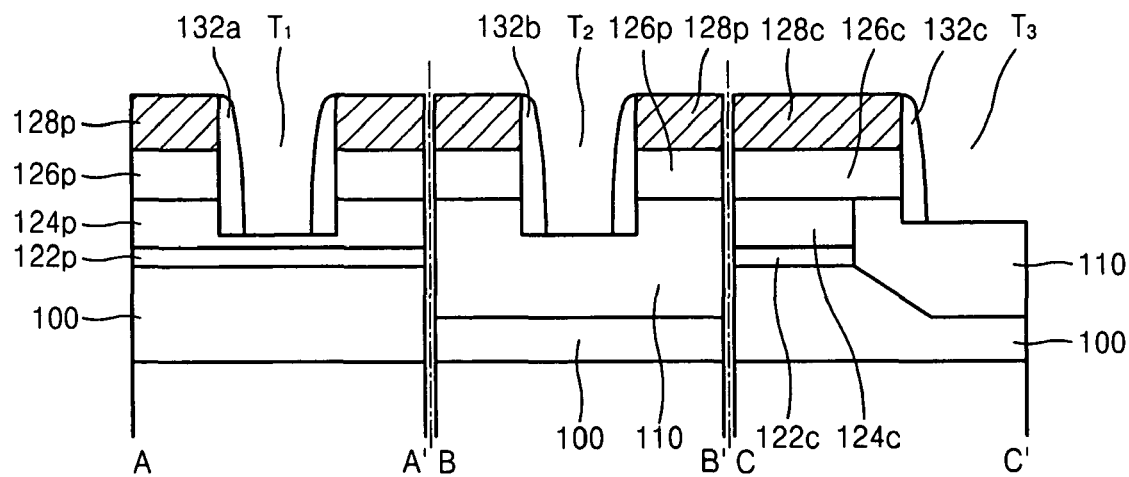

Referring to FIGS. 6A and 6B, first through third spacers 132a, 132b, and 132c may be respectively formed on sidewalls of first through third trenches T1, T2, and T3. The first spacer 132a may be formed on exposed sidewalls of the peripheral gate conductive layer 128p, the peripheral blocking insulating layer 126p, and the peripheral charge storage layer 124p. The second spacer 132b may be formed on exposed sidewalls of the peripheral gate conductive layer 128p, the peripheral blocking insulating layer 126p, and the device isolation region 110. For example, as illustrated in FIG. 6A, the first and second spacers 132a and 132b may be formed on the inner sidewalls of the first and second trenches T1 and T2, so the first and second spacers 132a and 132b may define an inner ring shape on an inner sidewall of the ring-type pattern of the peripheral gate conductive layer 128p from a plan view, e.g., the first and second spacers 132a and 132b may be formed continuously on an entire inner sidewall of the ring-type pattern. The third spacer 132c may be formed on exposed sidewalls of the cell gate conductive layer 128c, the cell blocking insulating layer 126c, and the device isolation region 110. For example, as illustrated in FIG. 6A, the third spacer 132c may completely surround outer sidewalls of the cell gate conductive layers 128c, e.g., each cell gate conductive layer 128c may be surrounded entirely and separately by one third spacer 132c. The first through third spacers 132a, 132b, and 132c may be formed using an etch-back process. The first through third spacers 132a, 132b, and 132c may have conductivity and may be formed of, e.g., polysilicon. However, the inventive concept is not limited thereto, e.g., only the first spacer 132a may be formed by using a conventional masking process, and the second and third spacers 132b and 132c may not be formed.

Figure 7A:
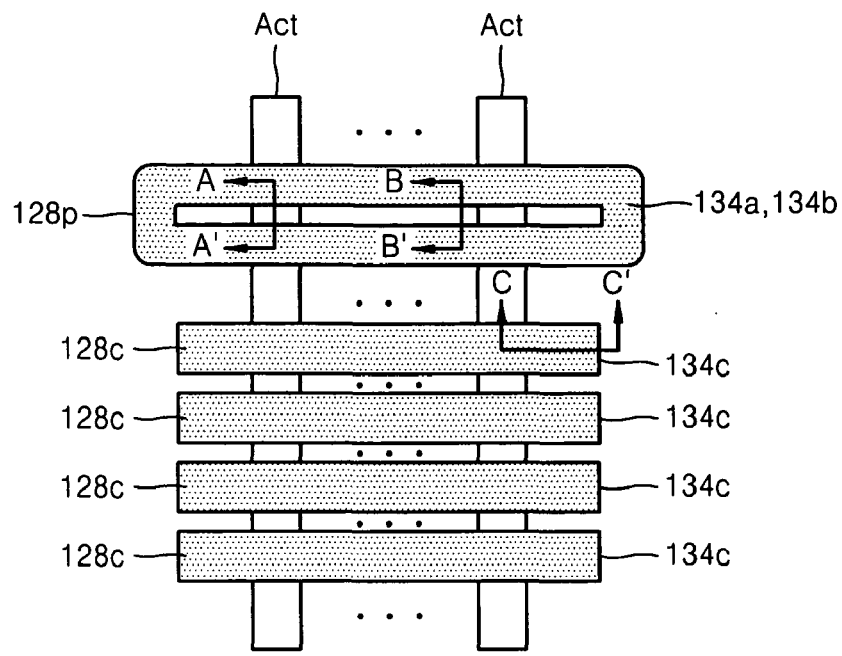
Figure 7B:
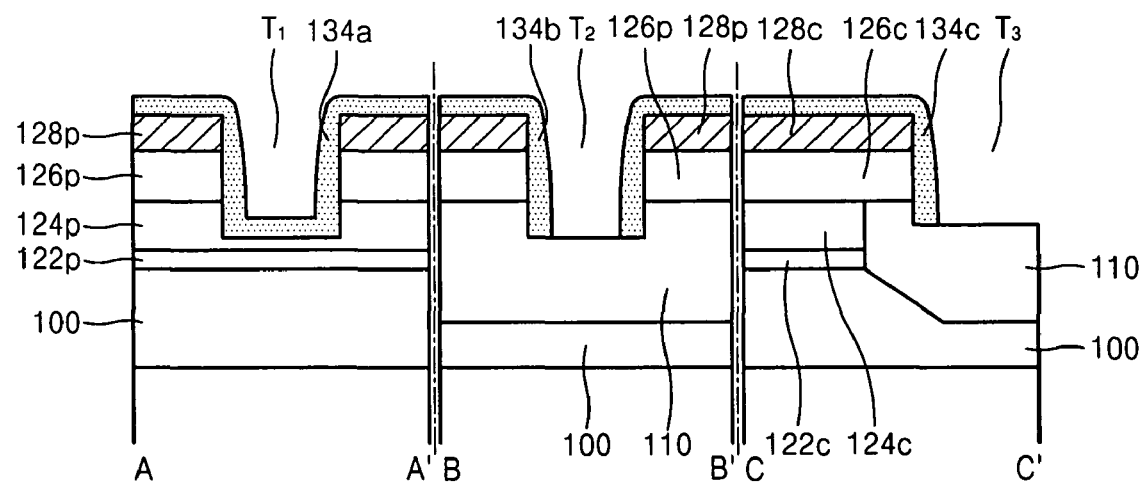

Referring to FIGS. 7A and 7B, first through third silicide layers 134a, 134b, and 134c may be formed by performing a silicidation process on the first through third spacers 132a, 132b, and 132c by using a metal. For example, the first through third spacers 132a, 132b, and 132c may be reacted with metal, e.g., metal may be deposited on the first through third spacers 132a, 132b, 132c in any suitable method. Here, the metal may be any suitable material capable of reacting with silicon to form a silicide. In this regard, the metal may be, e.g., one or more of cobalt (Co), nickel (Ni), titanium (Ti), tungsten (W), and a composition thereof. For example, the metal may be used in the form of a gas or a precursor when deposited on the first through third spacers 132a through 132c, and may be processed, e.g., may be exposed to a high temperature, to form the first through third silicide layers 134a through 134c, respectively. Thus, the first through third silicide layers 134a, 134b, and 134c may include, e.g., cobalt silicide (CoSi), nickel silicide (NiSi), titanium silicide (TiSi), tungsten silicide (WSi), or a composition thereof. When the peripheral charge storage layer 124p, the peripheral gate conductive layer 128p, and the cell gate conductive layer 128c include polysilicon, the polysilicon may react with the metal and, thus, may form a silicide layer. For example, when the peripheral charge storage layer 124p and peripheral gate conductive layer 128p include polysilicon, and metal is reacted with the peripheral charge storage layer 124p, peripheral gate conductive layer 128p and the first spacer 132a thereon, the first silicide layer 134a may be formed not only on the first spacer 132a but also may be formed on the peripheral charge storage layer 124p and peripheral gate conductive layer 128p.

In other words, as illustrated in FIG. 7B, the first silicide layer 134a may be formed on inner surfaces of the first trench T1, e.g., on entire bottom and sidewalls of the first trench T1, to cover the exposed surface of the peripheral charge storage layer 124p facing away from the semiconductor layer 100 and exposed surfaces of the first trench T1, e.g., entire side surface of the peripheral gate conductive layer 128p facing the first trench T1. The first silicide layer 134a may further cover, e.g., completely cover and overlap, a top surface of the peripheral gate conductive layer 128p, i.e., a surface of the peripheral gate conductive layer 128p facing away from the semiconductor layer 100.

The second silicide layer 134b may be formed not only on the second spacer 132b but also formed on the top surface of the peripheral gate conductive layer 128p. Also, the third silicide layer 134c may be formed not only on the third spacer 132c but also formed on a sidewall and a top surface of the cell gate conductive layer 128c. Also, when the second and third spacers 132b and 132c are not formed as described previously, the second and third silicide layers 134b and 134c may not be formed. The first silicide layer 134a may be electrically connected to the peripheral charge storage layer 124p. Accordingly, the first silicide layer 134a may define the butting contact structure 130 in a peripheral region transistor and also may function as a gate electrode.

Figure 8A:
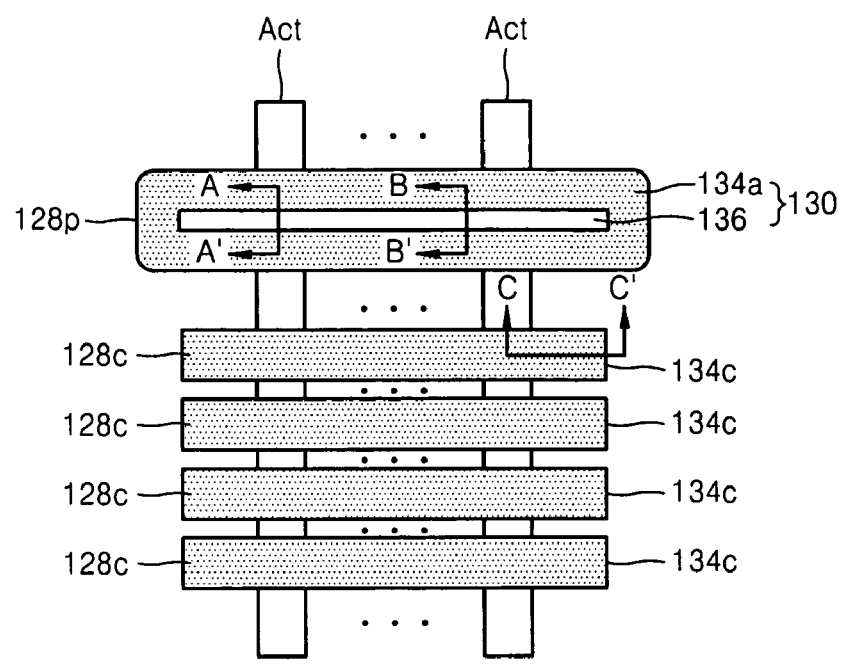
Figure 8B:
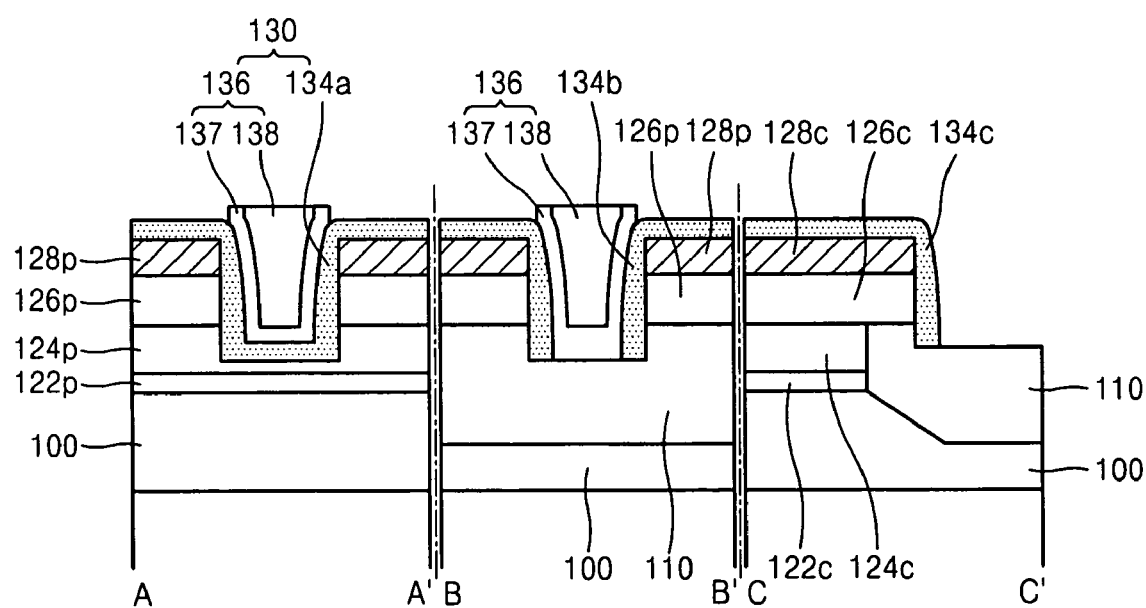

Referring to FIGS. 8A and 8B, an electrode layer 136 may be optionally formed on the first silicide layer 134a so as to fill, e.g., completely fill, the first trench T1. The electrode layer 136 may also be formed on the second silicide layer 134b so as to fill the second trench T2. The electrode layer 136 may be a single layer or multi-layer including, e.g., at least one of aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and nitrides or silicides thereof. For example, the electrode layer 136 may be formed as a multi-layer including a titanium/titanium nitride (Ti/TiN) layer 137 and a tungsten layer 138. An insulating layer (not shown), e.g., an oxide, nitride, or oxynitride layer, may be further formed between the first silicide layer 134a and the electrode layer 136. The electrode layer 136 may be electrically connected to the first silicide layer 134a and may be electrically connected to the peripheral charge storage layer 124p. For example, when the first silicide layer 134a is not formed above the peripheral charge storage layer 124p, the electrode layer 136 may be electrically connected to the peripheral charge storage layer 124p. Accordingly, the first silicide layer 134a and the electrode layer 136 may define the butting contact structure 130, which may be easily formed for electrically and directly connecting between a charge storage layer and a control gate.

Figure 9A:
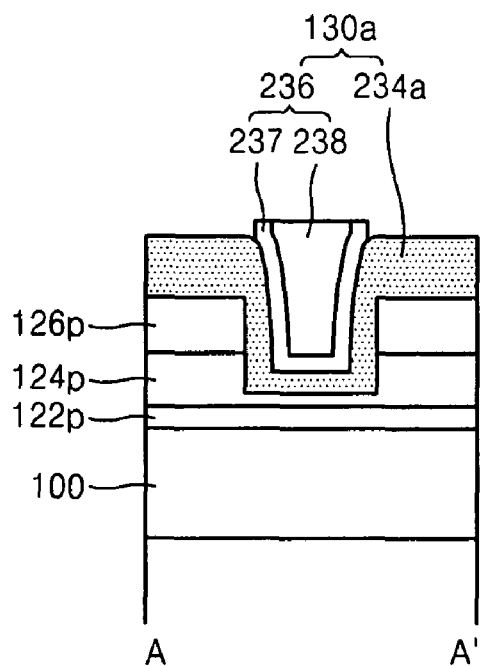
FIGS. 9A and 9B illustrate cross-sectional views of non-volatile memory devices according to other embodiments.
Figure 9B:
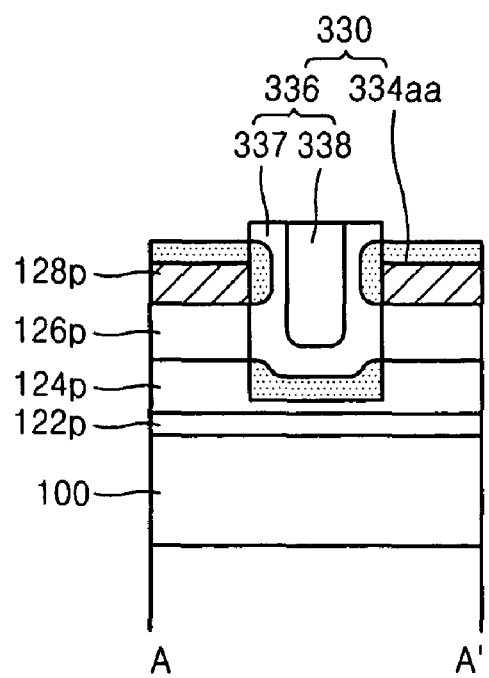

FIGS. 9A and 9B illustrate cross-sectional views of non-volatile memory devices according to other embodiments of the inventive concept.

Referring to FIG. 9A, a non-volatile memory device according to an embodiment of the inventive concept may be substantially the same as the non-volatile memory device of FIGS. 8A-8B, with the exception of including a butting contact structure 130a with a first silicide layer 234a instead of the first silicide layer 134a. The first silicide layer 234a may be formed by performing a silicidation process on the entire peripheral gate conductive layer 128p (See FIG. 8B), e.g., the first silicide layer 234a may be in direct contact with at least two substantially perpendicular surfaces of the peripheral blocking insulating layer 126p. In this regard, the peripheral gate conductive layer 128p may be formed of polysilicon and may be silicided using a metal, thereby forming the first silicide layer 234a. As described above, an electrode layer 236 having multi-layer of a titanium/titanium nitride (Ti/TiN) layer 237 and a tungsten layer 238 may be formed in a trench, i.e., on the first silicide layer 234a.

Referring to FIG. 9B, a non-volatile memory device according to another embodiment of the inventive concept may be substantially the same as the non-volatile memory device of FIGS. 8A-8B, with the exception of including an electrode layer 336 that directly contacts a sidewall of the peripheral blocking insulating layer 126p. For example, a portion of the first spacer 132a (see FIG. 6B) may not be formed on the sidewall of the peripheral blocking insulating layer 126p or a portion of the first spacer 132a may be formed of an insulating material, i.e., may not include polysilicon, so the electrode layer 336 may contact the peripheral blocking insulating layer 126p. Therefore, a butting contact structure 330 may include a first silicide layer 334aa and the electrode layer 336, which may be formed as a multi-layer including a titanium/titanium nitride (Ti/TiN) layer 337 and a tungsten layer 338. For example, the first silicide layer 334aa may be on, e.g., directly on, at least two perpendicular surfaces of the peripheral gate conductive layer 128p and on, e.g., directly on, at least two perpendicular surfaces of the peripheral charge storage layer 124p. Although not illustrated in the drawings, similar to the embodiment of FIG. 9A, the first silicide layer 334aa may be formed by performing a silicida tion process on the entire peripheral gate conductive layer 128p.

Figure 10:
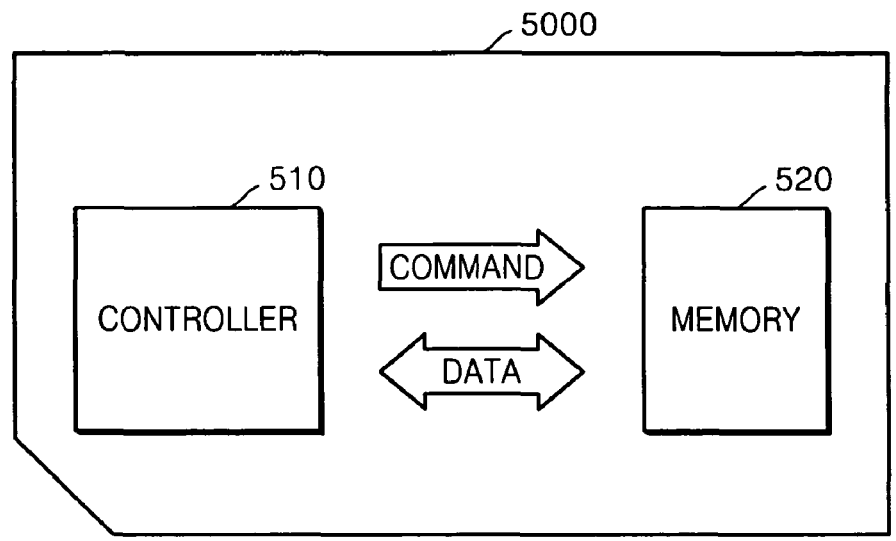
FIG. 10 illustrates a schematic view of a memory card according to an embodiment.

FIG. 10 illustrates a schematic view of an embodiment of a memory card 5000 according to an embodiment.

Referring to FIG. 10, a controller 510 and a memory 520 may be disposed to send/receive electric signals to/from each other. For example, when the controller 510 gives a command to the memory 520, the memory 520 may send data. The memory 520 may include a non-volatile memory device according to an embodiment. The non-volatile memory devices according to the various embodiments may be disposed in NAND or NOR architecture arrays in correspondence to the logic gate design. Such NAND and NOR arrays are generally known in the art. The memory arrays disposed in a plurality of rows and columns may have one or more memory array bank (not shown). The memory 520 may include any suitable memory array (not shown) or memory array bank (not shown). The memory card 5000 may further include any suitable and conventional members, e.g., a conventional row decoder (not shown), a column decoder (not shown), input/output (I/O) buffers (not shown), and/or a control resistor (not shown) in order to drive the memory array bank (not shown). The memory card 5000 may be used in memory devices as a memory card, e.g., a memory stick card, a smart media (SM) card, a secure digital (SD) card, a mini SD card, or a multi media card (MMC).

Figure 11:
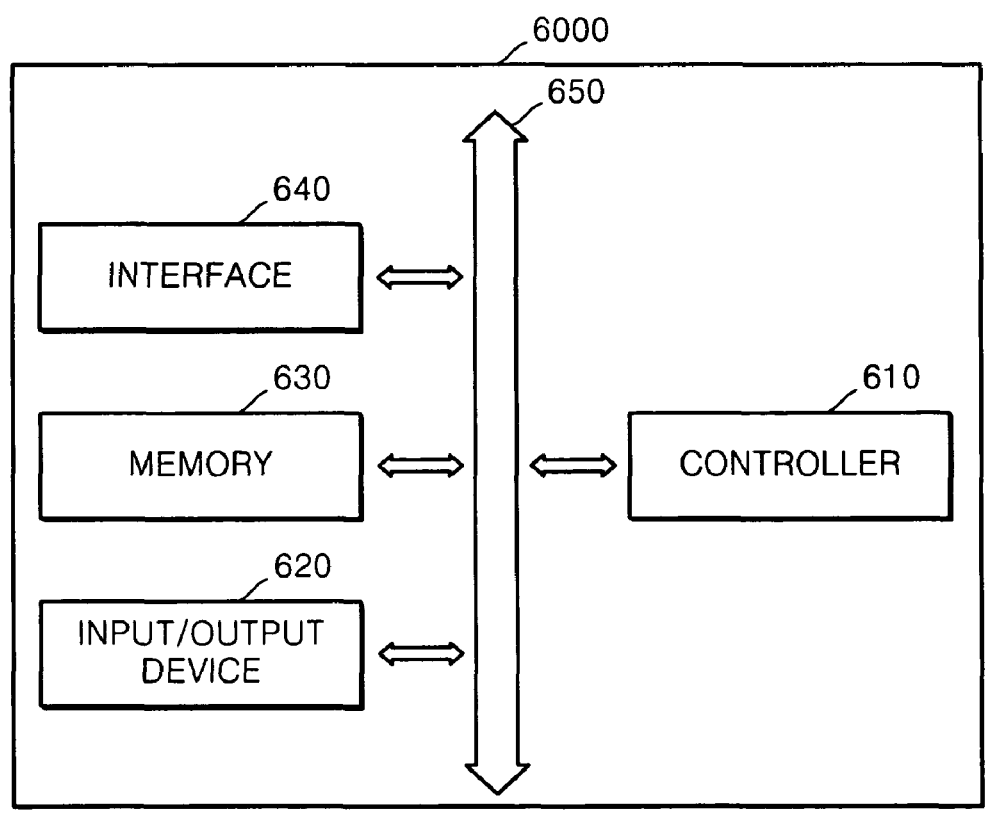
FIG. 11 illustrates a schematic view of a system according to an embodiment.

FIG. 11 illustrates a schematic diagram of a system 6000 including a non-volatile memory device according to an embodiment.

Referring to FIG. 11, the system 6000 may include a controller 610, an input/output device 620, a memory 630, and an interface 640. The system 6000 may be a mobile system or a system that transmits or receives data. The mobile system may be, e.g., a personal digital assistant (PDA), a portable computer, a web tablet, a wireless phone, a mobile phone, a digital music player, or a memory card. The controller 610 executes a software program and controls the system 6000. The controller 610 may be, e.g., a microprocessor, a digital signal processor, a microcontroller, or the like. The input/output device 630 may be used to input or output data of the system 6000. The system 6000 may be connected to an external apparatus, e.g., a personal computer or a network, using the input/output device 620, to send/receive data to/from the external apparatus. The input/output device 620 may be, e.g., a keypad, a keyboard, or a display. The memory 630 may store codes and/or data for operating the controller 610 and/or may store data processed by the controller 610. The memory 630 may include a non-volatile memory device according to an embodiment. The interface 640 may be a data transmission path between the system 6000 and the external apparatus. The controller 610, the input/output device 620, the memory 630, and the interface 640 may communicate with one another by a bus 650. For example, the system 6000 may be used for a mobile phone, a MP3 player, a navigation system, a portable multimedia player (PMP), a solid state disk (SSD), or a household appliance.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a non-volatile memory device, the method comprising:
   providing a semiconductor layer, a cell region and a peripheral region being defined in the semiconductor layer;
   sequentially forming a first insulating layer, a first conductive layer, a second insulating layer, and a second conductive layer in the cell region and in the peripheral region of the semiconductor layer;
   forming a trench exposing a portion of the first conductive layer in the peripheral region, the trench being formed by removing portions of the second conductive layer and the second insulating layer in the peripheral region;
   performing a trimming operation to remove portions of the second conductive layer and the second insulating layer in the cell region;
   forming a spacer on a side surface of the trench; and
   forming a silicide layer in the trench by performing a silicidation process on the spacer with a metal, the silicide layer being electrically connected to the first conductive layer.

2. The method as claimed in claim 1, wherein forming the trench and performing the trimming operation are performed simultaneously.

3. The method as claimed in claim 1, further comprising, after forming the silicide layer, forming an electrode layer by filling the trench, wherein the electrode layer is electrically connected to the silicide layer.

4. The method as claimed in claim 1, wherein the electrode layer is formed to directly contact the second insulating layer.

5. The method as claimed in claim 1, wherein forming the silicide layer further comprises performing the silicidation process at least on a portion of the second conductive layer in the peripheral region.

6. The method as claimed in claim 5, wherein forming the silicide layer further comprises performing the silicidation process on the entire second conductive layer in the peripheral region, such that the silicide layer is directly on at least two perpendicular surfaces of the second insulating layer.

7. The method as claimed in claim 1, wherein the spacer is formed of polysilicon.

8. The method as claimed in claim 1, wherein the metal in the silicidation process includes one or more of cobalt (Co), nickel (Ni), titanium (Ti), tungsten (W), and a composition thereof.

9. The method as claimed in claim 1, wherein sequentially forming the first insulating layer, first conductive layer, second insulating layer, and second conductive layer includes forming a plurality of cell transistors in the cell region and forming at least one of a string selection transistor, a ground selection transistor, a low voltage transistor, and a high voltage transistor in the peripheral region.

10. The method as claimed in claim 1, wherein the cell region is patterned using a self-aligned double patterning (SADP) method.

11. The method as claimed in claim 1, wherein the first and second conductive layers are formed of polysilicon.

12. The method as claimed in claim 1, wherein forming the silicide layer includes further performing the silicidation process on the first and second conductive layers, the silicide layer being formed on the exposed portion of the first conductive layer in the trench and on exposed surfaces of the second conductive layer in the peripheral region.

13. The method as claimed in claim 12, wherein forming the silicide layer on the second conductive layer includes forming the silicide layer to overlap at least two surfaces of the second conductive layer, the two surfaces of the second conductive layer being perpendicular to each other.

14. The method as claimed in claim 12, wherein forming the silicide layer on the second conductive layer includes forming the silicide layer to overlap an entire top surface of the second conductive layer in the peripheral region, the top surface of the conductive layer facing away from the semiconductor layer.

15. A method of manufacturing a non-volatile memory device, the method comprising:
   providing a semiconductor layer, the semiconductor layer including an active region defined by a device isolation region, and a cell region and a peripheral region being defined in the semiconductor layer;
   sequentially forming a first insulating layer, a first conductive layer, a second insulating layer, and a second conductive layer in the cell region and the peripheral region;
   forming a trench in the active region, the trench exposing a portion of the first conductive layer in the peripheral region, the trench being formed by removing portions of the second conductive layer and the second insulating layer in the peripheral region disposed in the active region;
   performing a trimming operation to remove portions of the second conductive layer and the second insulating layer in the cell region;
   forming a spacer on a side surface of the trench; and
   forming a silicide layer by performing a silicidation process on the spacer with a metal, the silicide layer being electrically connected to the first conductive layer.

16. A method of manufacturing a non-volatile memory device, the method comprising:
   providing a semiconductor layer, a cell region and a peripheral region being defined in the semiconductor layer;
   sequentially and respectively forming a first insulating layer, a first conductive layer, a second insulating layer, and a second conductive layer in the cell region and the peripheral region;
   forming a trench exposing a portion of the first conductive layer in the peripheral region, the trench being formed by removing portions of the second conductive layer and the second insulating layer in the peripheral region;
   performing a trimming operation to remove portions of the second conductive layer and the second insulating layer in the cell region;
   forming a silicide layer by performing a silicidation process on an exposed surface of the first conductive layer and on an exposed side surface of the second conductive layer, the silicidation process being performed by using a metal; and
   forming an electrode layer that is electrically connected to the silicide layer and the first conductive layer.

* * * * *